(12) United States Patent
Satomi et al.

(10) Patent No.: US 6,750,555 B2
(45) Date of Patent: Jun. 15, 2004

(54) SEMICONDUCTOR SRAM HAVING LINEAR DIFFUSION REGIONS

(75) Inventors: Katsuji Satomi, Osaka (JP); Hiroyuki Yamauchi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/263,914

(22) Filed: Oct. 3, 2002

(65) Prior Publication Data

US 2003/0067819 A1 Apr. 10, 2003

(30) Foreign Application Priority Data

Oct. 5, 2001 (JP) ........................... 2001-310514

(51) Int. Cl.$^7$ ............................................. H01L 27/11
(52) U.S. Cl. .................. 257/903; 257/E27.098
(58) Field of Search .................. 257/903, E27.098

(56) References Cited

U.S. PATENT DOCUMENTS

| | | | |
|---|---|---|---|
| 5,051,860 A | * | 9/1991 | Lee et al. ............... 361/58 |
| 5,744,844 A | | 4/1998 | Higuchi |
| 5,930,163 A | | 7/1999 | Hara et al. |
| 6,268,627 B1 | * | 7/2001 | Ishigaki et al. ......... 257/336 |
| 6,347,062 B2 | * | 2/2002 | Nii et al. ............. 365/230.05 |
| 2002/0117722 A1 | * | 8/2002 | Osada et al. ........... 257/379 |

OTHER PUBLICATIONS

K.J. Kim et al., "A Novel 6.4$\mu m^2$ Full–CMOS SRAM Cell with Aspect Ratio of 0.63 in a High–Performance 0.25$\mu m$—Generation CMOS Technology", *1998 Symposium on VLSI Technology Digest of Technical Papers*, pp. 68–69 (1998).

* cited by examiner

*Primary Examiner*—David Nelms
*Assistant Examiner*—Tu-Tu Ho
(74) *Attorney, Agent, or Firm*—Akin Gump Strauss Hauer & Feld, L.L.P.

(57) ABSTRACT

A semiconductor memory device has a SRAM memory cell comprising: a first inverter including a first nMOS transistor and a first pMOS transistor; a second inverter including a second nMOS transistor and a second pMOS transistor; a third nMOS transistor; and a fourth nMOS transistor, wherein a first diffusion region forming the first and third nMOS transistors and a second diffusion region forming the second and fourth nMOS transistors, respectively, are arranged in linear shapes without having any bent part, and driving capabilities of the first and second nMOS transistors are higher than those of the third and fourth nMOS transistors.

5 Claims, 7 Drawing Sheets

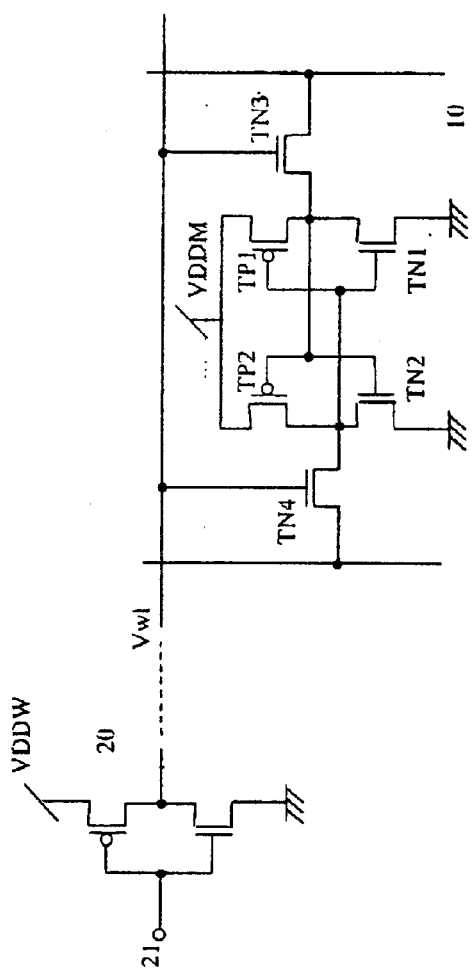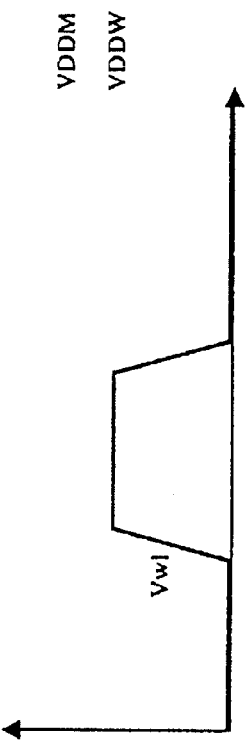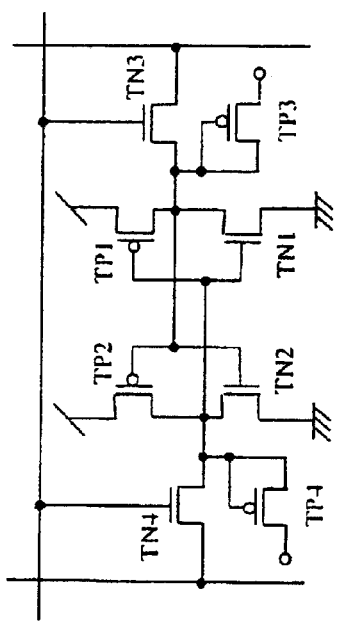
FIG. 4
FIG. 5
FIG. 3

SEMICONDUCTOR SRAM HAVING LINEAR DIFFUSION REGIONS

BACKGROUND OF THE INVENTION

The present invention relates to memory cell layout of CMOS-type SRAM (Complementary Metal Oxide Semiconductor Static Random Access Memory) among semiconductor memory devices.

The SRAM memory cell that comprises six transistors and is made by a typical semiconductor CMOS process is widely used for system LSIs and so on.

The prior art layout pattern of the CMOS-type SRAM memory cell will be described below with reference to FIG. 8.

The prior art SRAM memory cell comprises nMOS drive transistors TN1 and TN2, nMOS access transistors TN3 and TN4, pMOS load transistors TP1 and TP2, polysilicon wires PL1, PL2, PL3 and PL4, wiring layers AL1 and AL2, and contacts CN1, CN2, CL1 and CL2.

The nMOS drive transistor TN1 and the nMOS access transistor TN3 are formed on an n-type diffusion region DN1 and the nMOS drive transistor TN2 and the nMOS access transistor TN4 are formed on an n-type diffusion region DN2. The pMOS load transistor TP1 is formed on a p-type diffusion region DP1 and the pMOS load transistor TP2 is formed on a p-type diffusion region DP2.

Gates of the nMOS drive transistor TN1 and the pMOS load transistor TP1 are connected to each other with the polysilicon wire PL1 and drains of them are connected to each other with the wiring layer AL1 via contact, thereby forming a first inverter (CMOS structure). Gates of the nMOS drive transistor TN2 and the pMOS load transistor TP2 are connected to each other with the polysilicon wire PL2 and drains of them are connected to each other with the wiring layer AL2 via contact, thereby forming a second inverter (CMOS structure). The wiring layer AL1 as an output node of the first inverter is connected to PL2 as an input node of the second inverter, and the wiring layer AL2 as an output node of the second inverter is connected to PL1 as an input node of the first inverter. Thereby a latch circuit for holding data is formed.

A drain of the nMOS access transistor TN3 is connected to the wiring layer AL1 as the output node of the first inverter and source thereof is connected to a bit line (not shown) extending longitudinally via the contact CN1. A drain of the nMOS access transistor TN4 is connected to the wiring layer AL2 as the output node of the second inverter and source thereof is connected to another bit line (not shown) extending longitudinally via the contact CN2. Gates of TN3 and TN4 are connected to a word line (not shown) extending transversally via the contacts CL1 and CL2, respectively.

With such memory cell layout, long lateral distance allows a wide interval between two bit lines so that coupling capacitance between bit lines, which may cause a problem in micro process, can be reduced. Therefore, such memory cell layout is advantageous to speeding-up.

Next, relationship between capability ratio of drive transistors and access transistors and stability of data holding in the SRAM memory cell will be explained with reference to FIGS. 9, 10 and 11.

FIG. 9 shows a memory cell circuit diagram for evaluating stability of data holding. This circuit assumes the situation that the access transistors TN3 and TN4 turns on when the word line is in VDD level for a reading operation, and the bit line is raised to precharge level.

FIG. 10 shows input/output characteristics of two inverter circuits (INV1, INV2) in the latch circuit.

Ain-Aout and Bin-Bout represent characteristics of INV1 and INV2, respectively and it is plotted so as to be Ain=Bout and Bin=Aout. Cross points P1 and P2 in this drawing are stable points and each point corresponds to memory data 0 or 1. In the plot, as area surrounded by two curved lines becomes larger, stability of data holding at P1 and P2 improves. Here, when driving capability of the access transistors TN3 and TN4 becomes greater than that of nMOS transistors (drive transistors) TN1 and TN2 in the inverter circuits, input/output characteristics of the inverter circuits change as shown in FIG. 11. The reason is that the access transistors transmit VDD level of the bit line to the latch nodes more easily, so that area surrounded by two curved lines becomes smaller. When noise voltage is applied into the memory cell having such characteristics, cross points are reduced to be only P2' and therefore the memory cell can hold only either data. That is, in the case where data other than P2' (i.e. P1') is held, the data is destroyed. Thus, maintaining a constant ratio of access transistors to drive transistors in driving capability is important for holding memory cell data stably. Generally, driving capability of access transistors is set to be 50 to 70% of that of drive transistors.

In the prior art SRAM memory cell, channel width of drive transistors is set to be larger than that of access transistors, thereby generating a difference between them in driving capability.

In the prior art SRAM memory cell in which channel width of the drive transistors is set to be larger than that of the access transistors, thereby generating a difference between them in driving capability, the diffusion regions necessarily include some bent parts and end parts. For example, in FIG. 8, the bent parts that produce round-offs as shown by dashed lines DL3 and DL4 are generated by difference between the nMOS drive transistors TN1 and TN2 and the corresponding nMOS access transistors TN3 and TN4 in channel width.

With such layout, at the bent parts of the diffusion regions, finish pattern is rounded off as shown by dashed lines DL1, DL2, DL3 and DL4 in the figure. As a result, a problem arises that transistor width of the nMOS transistors TN1, TN2, TN3 and TN4 becomes larger than required. Moreover, at the end parts of the diffusion regions, finish pattern is retreated as shown by dashed-lines DL5 and DL6. As a result, there arises a problem of reduction in overlap margin of the p-type diffusion region with respect to the contact as well as variation in channel width of the pMOS transistors TP1 and TP2.

Furthermore, system mounted on a semiconductor chip has increasingly become large scale. In connection with this, there is a tendency that the block of SRAM with a large scale in bit capacity is mounted on the chip. In order to meet these requests on the system side, it is desired to further reduce the size of SRAM memory cell. Although it is effective to use a MOS transistor with smaller channel width for the purpose of reducing cell size, such small-sized pattern is prone to undergo great variations in characteristics due to processing fluctuations. Therefore, reduction in cell size makes stable design by sufficient operational margin difficult. On the other hand, with recent micro process, it is more difficult to obtain desirable processed form and round-off or retreat of pattern tend to take place. Moreover, there often causes the phenomenon that even the same pattern form changes in finished form due to peripheral pattern form.

To suppress such changes of processed form, it has already been implemented to correct mask pattern in consideration of bend up and bend down of layout pattern concerned and in consideration of the peripheral layout pattern in recent micro process. Such process, however, is sensitive to apparatus used in semiconductor diffusion process and processing conditions. Further, correction value must be modified each time processing conditions in diffusion process are changed, adding a burdensome operation.

SUMMARY OF THE INVENTION

The present invention is made to solve the above-mentioned problems. With the memory cell layout of the semiconductor memory device according to the present invention, it is possible to lay out diffusion regions in linear shapes without any bent part by generating a difference between access transistors and drive transistors in driving capability without changing their channel width. As a result, processed form of diffusion areas of the SRAM memory cell is hard to change, thereby suppressing variations in characteristics of transistors so that transistors with narrow channel width can be used. An object of the present invention is to provide a highly integrated semiconductor memory device by use of such transistors with narrow channel width A semiconductor memory device according to one aspect of the present invention has a SRAM memory cell comprising: a first inverter including a first nMOS transistor and a first pMOS transistor; a second inverter including a second nMOS transistor and a second pMOS transistor; a third nMOS transistor; and a fourth nMOS transistor, wherein an input node of the first inverter is connected to an output node of the second inverter; and an input node of the second inverter is connected to an output node of the first inverter; either of drain and source of the third nMOS transistor is connected to the output node of the first inverter; the other of drain and source thereof is connected to a first bit line; and gate thereof is connected to a word line; either of drain and source of the fourth nMOS transistor is connected to the output node of the second inverter; the other of drain and source thereof is connected to a second bit line; and gate thereof is connected to the word line; a first diffusion region forming the first nMOS transistor and the third nMOS transistor and a second diffusion region forming the second nMOS transistor and the fourth nMOS transistor, respectively, are arranged in linear shapes without having any bent part, and current driving capability of the first and second nMOS transistors is higher than that of the third and fourth nMOS transistors.

A semiconductor memory device according to another aspect of the present invention is an above-mentioned semiconductor memory device characterized in that gate length of the third and fourth nMOS transistors is longer than that of the first and second nMOS transistors.

A semiconductor memory device according to another aspect of the present invention is an above-mentioned semiconductor memory device characterized in that threshold voltage characteristics of the third and fourth nMOS transistors are higher than those of the first and second nMOS transistors.

A semiconductor memory device according to another aspect of the present invention is an above-mentioned semiconductor memory device characterized in that a gate oxide film of the third and fourth nMOS transistors are thicker than that of the first and second nMOS transistors.

A semiconductor memory device according to another aspect of the present invention is an above-mentioned semiconductor memory device characterized in that driving voltage of the word line is lower than power supply voltage supplied to the first and second inverters.

A semiconductor memory device according to another aspect of the present invention is an above-mentioned semiconductor memory device characterized in that a third diffusion region forming the first pMOS transistor and a fourth diffusion region forming the second pMOS transistor are arranged in linear shapes without having any bent part and located in parallel to the first and second diffusion regions.

A semiconductor memory device according to another aspect of the present invention is an above-mentioned semiconductor memory device further comprising: a third pMOS transistor formed adjacent to drain of the first pMOS transistor on the third diffusion region; and a fourth pMOS transistor formed adjacent to drain of the second pMOS transistor on the fourth diffusion region, wherein gates of the first nMOS transistor, the first pMOS transistor and the fourth pMOS transistor are connected in succession via a first polysillicon wire; and gates of the second nMOS transistor, the second pMOS transistor and the third pMOS transistor are connected in succession via a second polysillicon wire; and absolute value of threshold voltage of the third and fourth pMOS transistors is higher than power supply voltage supplied to the first and second inverters.

A semiconductor memory device according to another aspect of the present invention is an above-mentioned semiconductor memory device characterized in that n-type diffusion regions are provided on the opposite side of the diffusion region of the third pMOS transistor to the first pMOS transistor and on the opposite side of the diffusion region of the fourth pMOS transistor to the second pMOS transistor to fix potential of N-well region forming pMOS transistors.

A semiconductor memory device according to another aspect of the present invention is an above-mentioned semiconductor memory device characterized in that, in a memory cell array in which the SRAM memory cells are arranged in a grid pattern, a substrate contact region for fixing well potential is provided at regular intervals in the extending direction of the first and second diffusion regions; a diffusion region forming the substrate contact region is arranged in a linear shape without any bent part on the extension of the first diffusion region and the second diffusion region of the memory cell; and a fifth nMOS transistor is provided at the boundary of the memory cell and the substrate contact region wherein gate potential thereof is fixed so as not to become ON state.

A semiconductor memory device according to another aspect of the present invention is an above-mentioned semiconductor memory device characterized in that, in a memory cell array in which the SRAM memory cells are arranged in a grid pattern, a substrate contact region for fixing well potential is provided at regular intervals in the extending direction of the third and fourth diffusion regions;, a diffusion region forming the substrate contact region is arranged in a linear shape without any bent part on the extension of the third diffusion region and the fourth diffusion region of the memory cell; and a fifth pMOS transistor is provided at the boundary of the memory cell and the substrate contact region wherein gate potential thereof is fixed so as not to become ON state.

A semiconductor memory device according to another aspect of the present invention is an above-mentioned semiconductor memory device characterized in that the first pMOS transistor is formed on the third diffusion region; the second pMOS transistor is formed on the fourth diffusion region; and the first, second, third and fourth diffusion regions are arranged at equally spaced intervals in the longitudinal direction of connect line of transistor gate.

A semiconductor memory device according to another aspect of the present invention is an above-mentioned semiconductor memory device characterized in that the first pMOS transistor is formed on the third diffusion region; the second pMOS transistor is formed on the fourth diffusion region; and the first, second, third and fourth diffusion regions are arranged so as to have same width measured in the longitudinal direction of connect line of transistor gate.

As a means of generating a difference in transistors' capability without changing channel width, channel length of the access transistors is set to be longer than that of the drive transistors. This enables memory cell data to be held stably. In the prior art difference in capability has been generated from difference in channel width. Therefore, even if minimum width of diffusion region, which is possible in processing, can be applied to the access transistors, the drive transistors cannot be laid out at minimum width. According to the present invention, however, minimum width of diffusion region can also be applied to the drive transistors. In typical transistors, channel width is longer than channel length, and therefore reduction in channel width in the present invention probably can reduce cell size.

However, in the prior art memory cell layout as shown in FIG. 8, because of its long sideways structure, longer channel length, which increases cell height, weakens the effect of reducing area by reduction in channel width of the drive transistor. Accordingly, in the present invention, as another means of generating a difference in transistors' capability, threshold voltage of the access transistor is set to be greater than that of the drive transistor. Further, as other means, gate oxide film of the access transistor is set to be thicker than that of the drive transistor. By use of these means, the access transistor and the drive transistor have different capability while having the same channel length and width so that the effect of reducing area can be obtained. In the case that the above-mentioned means for changing characteristics of the access transistor are employed, it is necessary to add a supplementary process, suffering a slight increase in process costs. Therefore, as another means according to the present invention, power supply voltage supplied to a word line driving circuit for driving the gate of the access transistor is set to be lower than that supplied to a latch circuit in the memory cell. As a result, it is possible to generate a capability difference between the access transistor and the drive transistor having the same size and characteristics, thereby holding process costs down.

As for the p-type diffusion region, removing end parts that exist in the prior art layout is employed. The p-type diffusion regions are arranged in linear shapes, and for the separation of pMOS load transistor devices between vertically adjoining cells, a pMOS separating transistor having an absolute value of threshold voltage greater than power supply voltage and being in OFF state at any time irrespective of gate potential is formed. This suppress changes of processed form in channel width of the load transistor due to retreat of pattern that occurs at the end part in the prior art, and also allows a sufficient overlap of the diffusion region with respect to the contact in the drain of load transistor. Looking from the aspect of the n-type diffusion region, the p-type diffusion region always lies next to the n-type diffusion region as its peripheral layout form. In the prior art layout, as the p-type diffusion region does not exist partly next to the n-type diffusion region, the processed form of the n-type diffusion region changes a part and the change must be corrected on the mask data. According to the present invention, the processed form of the n-type diffusion region can be improved without any correction.

Furthermore, fixing potential of N well forming the pMOS transistors by applying n-type diffusion on the opposite side of a pMOS separating transistor to load transistor is employed. Therefore, vacant region in the memory cell can be used effectively as substrate contact region. The substrate contact region for fixing potential of P well may be separately formed outside of the memory cell. Nevertheless, as potential of N well can be definitely fixed, latch-up resistance is improved. Moreover, a potential-fixed region of P well that formed separately can be set at larger intervals, thereby enabling area of the memory cell array to be suppressed.

Considering the layout of the whole memory cell array, it is necessary to provide the potential-fixed region of P well at regular intervals in the vertical direction of aligning memory cells. With the prior art layout, diffusion regions of memory cells above and under the potential-fixed region are necessarily separated. According to the present invention, by providing transistors whose gates are fixed in OFF state above and under the potential-fixed region both in n-type diffusion region and p-type diffusion region, the above-mentioned potential-fixed region of N well can be arranged in a linear shape in contiguous to the diffusion region of the memory cell. In this way, over the whole memory cell array, diffusion regions can be laid out in linear shapes without any bent part and partial separation, so that change in characteristics of transistors above and under the potential-fixed region can be suppressed.

Furthermore, in the present invention, placing each diffusion region at the same interval is employed. As mentioned above, in recent micro process, finished processed form changes due to peripheral layout form. In the case of plural placement intervals, it becomes difficult to shape plural diffusion regions into desired interval and width. Maintaining a constant placement interval facilitates keeping forms of these diffusion regions constant. Similarly, placing each diffusion region at the same width is employed. It also facilitates keeping width and forms of these diffusion regions constant.

The novel features of the invention are set forth with particularity in the appended claims. The invention as to both structure and content, and other objects and features thereof will best be understood from the detailed description when considered in connection with the accompanying drawings.

DESCRIPTION OF THE DRAWINGS

FIG. 3 is a circuit diagram of the CMOS-type SRAM memory cell of Embodiment 2.

FIG. 4 is a circuit diagram of a CMOS-type SRAM memory cell and a word line driving buffer of Embodiment 3.

FIG. 5 is a signal waveform diagram of the word line in the CMOS-type SRAM memory cell of Embodiment 3.

DESCRIPTION OF THE PREFERRED EMBODIMENT

Embodiments 1 to 4 as preferred embodiments of a semiconductor memory device according to the present invention will be described below.

<<Embodiment 1>>

Figure 1:
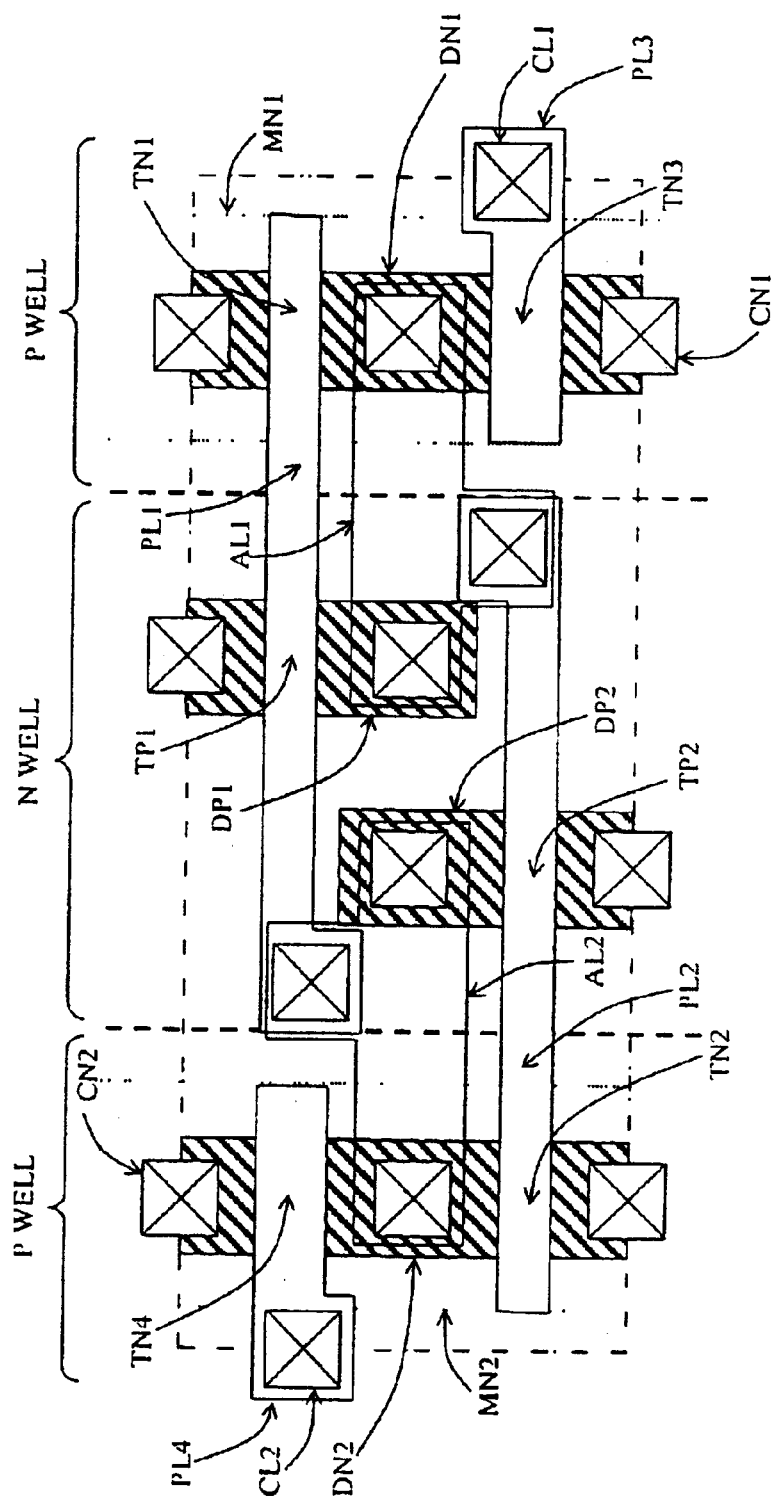
FIG. 1 is a diagram showing the layout of a CMOS-type SRAM memory cell of Embodiment 1.

FIG. 1 shows the layout of a CMOS-type SRAM memory cell of Embodiment 1 according to the present invention.

The CMOS-type SRAM memory cell of Embodiment 1 comprises nMOS drive transistors TN1 and TN2, nMOS access transistors TN3 and TN4, pMOS load transistors TP1 and TP2, polysilicon wires PL1, PL2, PL3 and PL4, wiring layers AL1 and AL2, and contacts CN1, CN2, CL1 and CL2.

The nMOS drive transistor TN1 and the nMOS access transistor TN3 are formed on an n-type diffusion region DN1 and the nMOS drive transistor TN2 and the nMOS access transistor TN4 are formed on an n-type diffusion region DN2. The pMOS load transistor TP1 is formed on a p-type diffusion region DP1 and the pMOS load transistor TP2 is formed on a p-type diffusion region DP2.

Gates of the nMOS drive transistor TN1 and the pMOS load transistor TP1 are connected to each other via the polysilicon wire PL1 and drains of them are connected to each other with the wiring layer AL1 via the contact, thereby forming a first inverter (CMOS structure). Gates if the nMOS drive transistor TN2 and the pMOS load transistor TP2 are connected to each other via the polysilicon wire PL2 and drains of them are connected to each other with the wiring layer AL2 via the contact, thereby forming a second inverter (CMOS structure). The wiring layer AL1 as an output node of the first inverter is connected to PL2 as an input node of the second inverter, and the wiring layer AL2 as an output node of the second inverter is connected to PL1 as an input node of the second inverter. This forms a latch circuit for holding data.

The drain of the nMOS access transistor TN3 is connected to the wiring layer AL1 as the output node of the first inverter and the source thereof is connected to a bit line (not shown) extending longitudinally via the contact CN1. The drain of the nMOS access transistor TN4 is connected to the wiring layer AL2 as the output node of the second inverter and the source thereof is connected to another bit line (not shown) extending longitudinally via the contact CN2. The gates of TN3 and TN4 are connected to a word line (not shown) extending transversally. MN1 and MN2 are masks for determining n-type diffusion region.

In this embodiment, the nMOS drive transistors TN1 and TN2 and the nMOS access transistors TN3 and TN4, respectively, have a same channel width. On the contrary, the nMOS access transistors TN3 and TN4 are longer than the nMOS drive transistors TN1 and TN2 in channel length. Accordingly, the driving capability of the nMOS access transistors TN3 and TN4 becomes smaller than that of the nMOS drive transistors TN1 and TN2, resulting in that memory data can be held stably. Owing to the uniform channel width, it is possible to lay out the n-type diffusion regions DN1 and DN2 in linear shapes without any bent part. As a result, no change of transistor width due to round-off takes place, thereby preventing variations in characteristics of these nMOS transistors.

<<Embodiment 2>>

Figure 2:
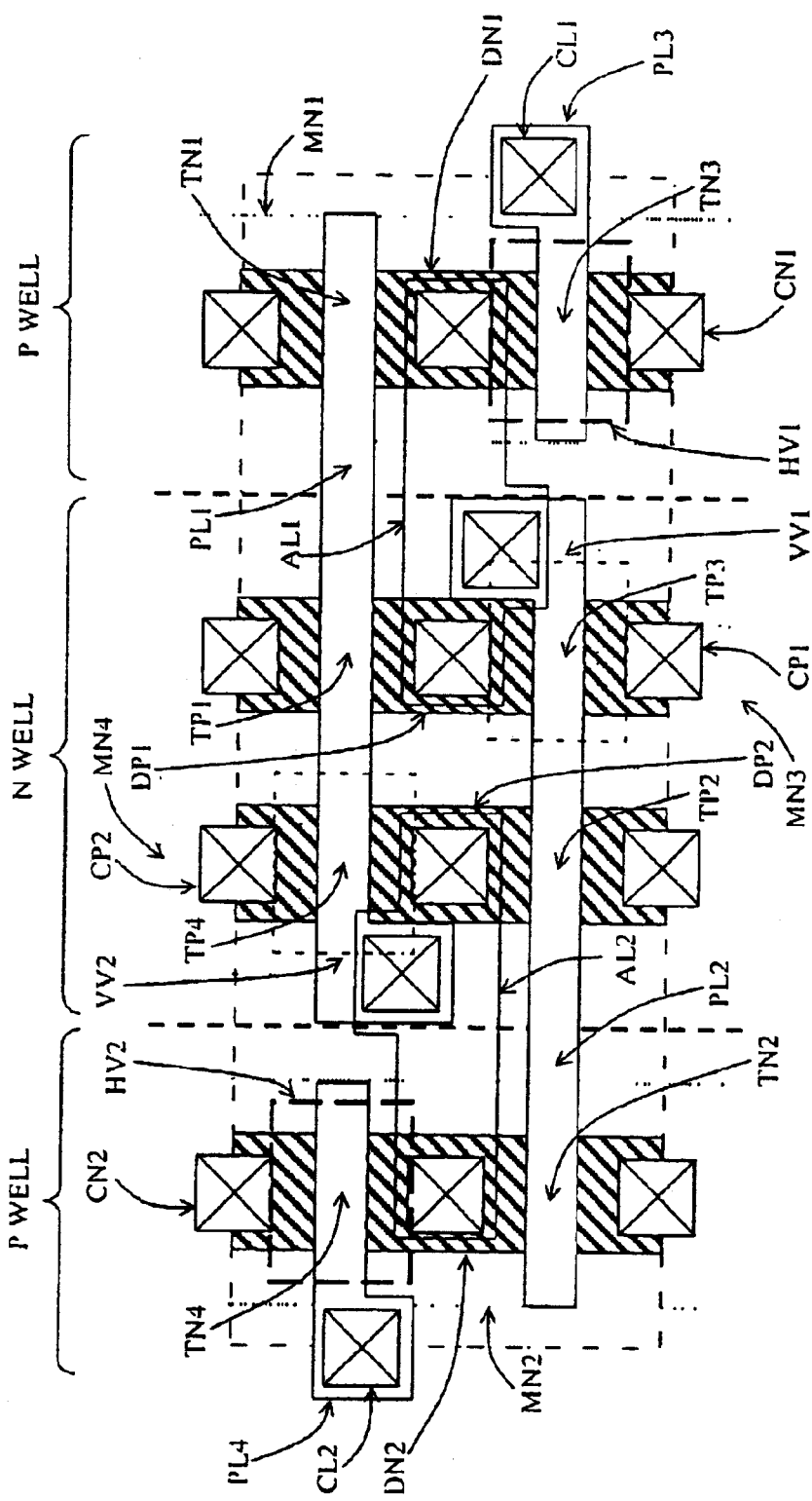
FIG. 2 is a diagram showing the layout of a CMOS-type SRAM memory cell of Embodiment 2.

FIG. 2 shows the layout of a CMOS-type SRAM memory cell of Embodiment 2 according to the present invention.

In FIG. 2, elements that serve the similar function as in Embodiment 1 are assigned the same reference numerals and detailed explanations thereof are omitted.

In this embodiment in contrast to Embodiment 1, all of the nMOS drive transistors TN1 and TN2 and the nMOS access transistors TN3 and TN4 have a same channel length. The gates of the nMOS access transistors TN3 and TN4 are covered with their respective masks HV1 and HV2 that determine an ion-injection region to increase the threshold voltage. The pMOS diffusion regions DP1 and DP2 are laid out in linear shapes so as to have no end part. The polysilicon wires PL1 and PL2 as input gates of a latch circuit cross the pMOS diffusion regions DP2 and DP1, respectively, thereby forming pMOS transistors TP4 and TP3. The gates of the pMOS transistors TP3 and TP4 are covered with their respective masks VV1 and VV2 that determine an ion-injection region so as to make an absolute value of threshold voltage greater than power supply voltage. Diffusion regions on the opposite side of TP3 and TP4 to TP1 and TP2, respectively, are covered with their respective masks MN3 and MN4 that determine n-type diffusion region.

With the memory cell layout of this embodiment, compared with the drive transistors TN1 and TN2, the access transistors TN3 and TN4 have a larger threshold voltage while having the same channel width and length. Accordingly, the driving capability of the nMOS access transistors TN3 and TN4 become smaller than that of the nMOS drive transistors TN1 and TN2, resulting in that memory data can be held stably. The memory cell of Embodiment 2 can be formed so as to be smaller in height than that of Embodiment 1.

FIG. 3 shows a circuit diagram of the memory cell in this embodiment.

The drain and gate of the pMOS transistor TP3 are connected to the output node of the first inverter and the drain and gate of the pMOS transistor TP4 are connected to the output node of the second inverter. Depending on data held in the memory cell, gate potential of TP3 and TP4 changes to GND level or power supply voltage (VDD) level. However, as TP3 and TP4 have a threshold voltage lower than −VDD, they are in OFF state all the time, and diffusion regions on both sides of each gate of TP3 and TP4 are electrically separated from each other. N-type diffusion is applied to one of the diffusion regions of TP3 and TP4 (i.e. diffusion region on the side which is not connected to the output node of the first inverter and the second inverter, respectively) so as to fix n-well potential via contacts CP1 and CP2, respectively.

In this embodiment, diffusion regions have neither bent part nor end part, and looking from the aspect of the n-type diffusion regions DN1 and DN2, p-type diffusion regions DP1 or DP2 always lies next to the n-type diffusion regions DN1 and DN2. For this reason, changes in processed form due to peripheral layout form occur in a similar manner at any place, facilitating finished form to be uniform. That is, it becomes easier to set processing conditions for keeping channel width of TN1 and TN3 as well as TN2 and TN4 same.

<<Embodiment 3>>

A CMOS-type SRAM memory of Embodiment 3 will be explained with reference to FIGS. 4 and 5. Layout of a memory cell of Embodiment 3 is similar to that of Embodiment 1 (FIG. 1). In the memory cell of Embodiment 1, channel length of the nMOS access transistors TN3 and TN4 are longer than that of nMOS drive transistors TN1 and TN2. In the memory cell of Embodiment 3, channel length of the nMOS access transistors TN3 and TN4 are same as that of nMOS drive transistors TN1 and TN2. Except for this point, both memory cells are identical with each other (refer to FIG. 1). Therefore, the memory cell of Embodiment 3 is shorter than that of Embodiment 1 in longitudinal direction.

FIG. 4 shows a circuit of the CMOS-type SRAM memory cell and a word line driving buffer of Embodiment 3 of the present invention. In FIG. 4, elements that serve the similar function as in Embodiment 2 (FIG. 3) are assigned the same reference numerals and detailed explanations thereof are omitted.

In FIG. 4, the drain of the nMOS access transistor TN3 is connected to the output node of the first inverter and the source thereof is connected to a bit line extending longitudinally. The drain of the nMOS access transistor TN4 is connected to the output node of the second inverter and the source thereof is connected to a bit line extending longitudinally. The gates of TN3 and TN4 are connected to a word line extending transversally.

The gates of the nMOS access transistor TN3 and TN4 are activated by a word line driver 20. Power supply potential VDDW of the word line driver 20 is set to be lower than power supply potential VDDM of the memory cell 10 (VDDW<VDDM). When a Low level is input to an input node 21 of the word line driver 20, the word line driver 20 outputs a High level with potential VDDW as shown in FIG. 5. At this time, the gates of the access transistors TN3 and TN4 are activated by VDDW. Meanwhile, the gate of either drive transistor TN1 or TN2 is activated by supply voltage VDDM of the memory cell.

As the voltage VDDW applied to the gates of access transistors is set to be lower than the voltage VDDM supplied to the memory cell (VDDW<VDDM), driving capability of the access transistors TN3 and TN4 is relatively smaller than that of the drive transistors TN1 and TN2, thereby enabling memory data to be held stably.

Also in the layout of memory cell of this embodiment as in Embodiment 2, the drive transistors TN1 and TN2 and the access transistors TN3 and TN4, respectively, have a same size of channel width and channel length. This achieves such an effect as obtained in Embodiment 2. Furthermore, in the present embodiment, the drive transistors TN1 and TN2 and the access transistors TN3 and TN4, respectively, have same threshold voltage characteristics.

With the CMOS-type SRAM of this embodiment, driving capability of access transistors can be made lower than that of drive transistors without any additional process to access transistors TN1 and TN2 as shown in Embodiment 2, and therefore processed form of diffusion regions can be improved while suppressing process costs.

<<Embodiment 4>>

Figure 6:
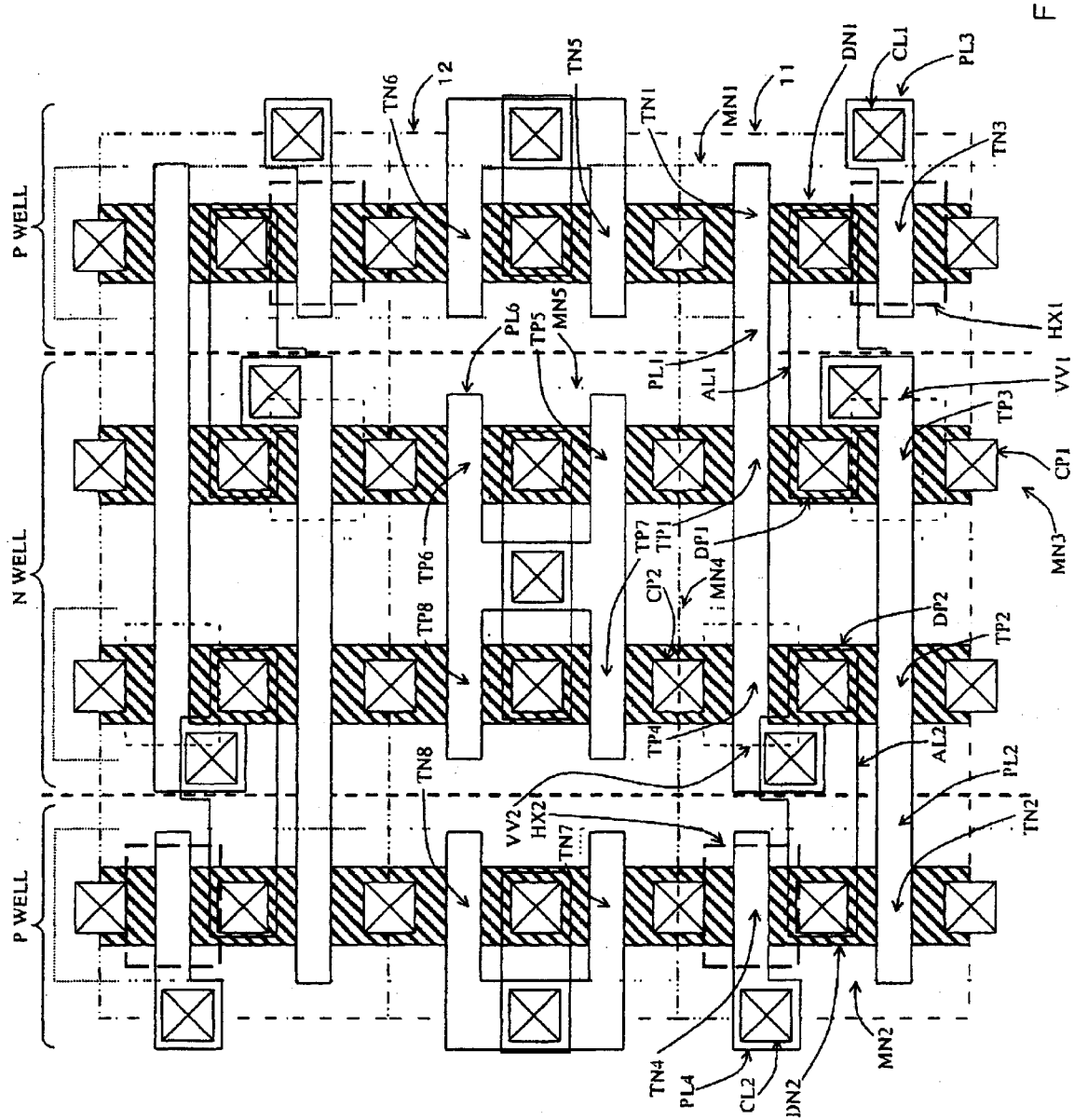
FIG. 6 is a diagram showing the layout of a CMOS-type SRAM memory cell and a substrate contact cell of Embodiment 4.

FIG. 6 shows layout of a CMOS-type SRAM memory cell and a substrate contact cell of Embodiment 4 according to the present invention.

In FIG. 6, numeral 11 designates the layout of memory cell and numeral 12 designates the layout of substrate contact cell. With the memory cell layout in FIG. 6, elements that serve the similar function as in Embodiment 2 (FIG. 2) are assigned the same reference numerals and detailed explanations thereof are omitted.

Transistors with a higher threshold voltage characteristic are employed as the access transistors TN3 and TN4 in the memory cell of Embodiment 2, while transistors thicker than the drive transistors TN1 and TN2 in gate oxide film are employed as the access transistors TN3 and TN4 in the memory cell of this embodiment.

HX1 and HX2 are masks for determining the region in which a thicker gate oxide film is formed. The access transistors TN3 and TN4 with a thicker gate oxide film have the same channel width and channel length as the drive transistors TN1 and TN2, but their driving capability is suppressed. Therefore, the memory cell has an excellent data holding characteristic.

Furthermore, in the memory cell of this embodiment, diffusion regions DN1, DP1, DP2 and DN2 are located at regular intervals and their width of the regions is same.

Next, the layout of the adjoining substrate contact cell 12 will be explained below. Diffusion regions on the substrate contact cell are extensions of diffusion regions of the memory cell 11 and arranged in linear shapes in a same way.

nMOS transistors TN5 and TN6, and TN7 and TN8 are located on the n-type diffusion regions DN1 and DN2, respectively, so as to electrically separating a transistor forming part of the memory cell from a substrate contact part. Similarly, pMOS transistors TP5 and TP6, and TP7 and TP8 are located on the p-type diffusion regions DP1 and DP2, respectively, so as to electrically separating a transistor forming part of the memory cell and a substrate contact part.

Diffusion region between the nMOS transistors TN5 and TN6 as well as diffusion region between the nMOS transistors TN7 and TN8 are not covered with masks MN1 and MN2 for applying n-type diffusion and p-type diffusion is applied to these regions. Meanwhile, diffusion region between the pMOS transistors TP5 and TP6 as well as diffusion region between the pMOS transistors TP7 and TP8 are covered with a mask MN5 for applying n-type diffusion so that n-type diffusion is applied to these regions. The gates of the nMOS transistors TN5 and TN6 are connected to each other. And, these gates as well as the p-type diffusion region between these transistors are connected to GND level. The same applies to the nMOS transistors TN7 and TN8. Meanwhile, the gates of the pMOS transistors TP5, TP6, TP7 and TP8 are connected to each other. And these gates as well as the n-type diffusion regions between these transistors are connected to VDD level. Such structure makes it possible to fix the well potential while electrically separating diffusion regions in the memory cell in both N well and P well.

Figure 7:
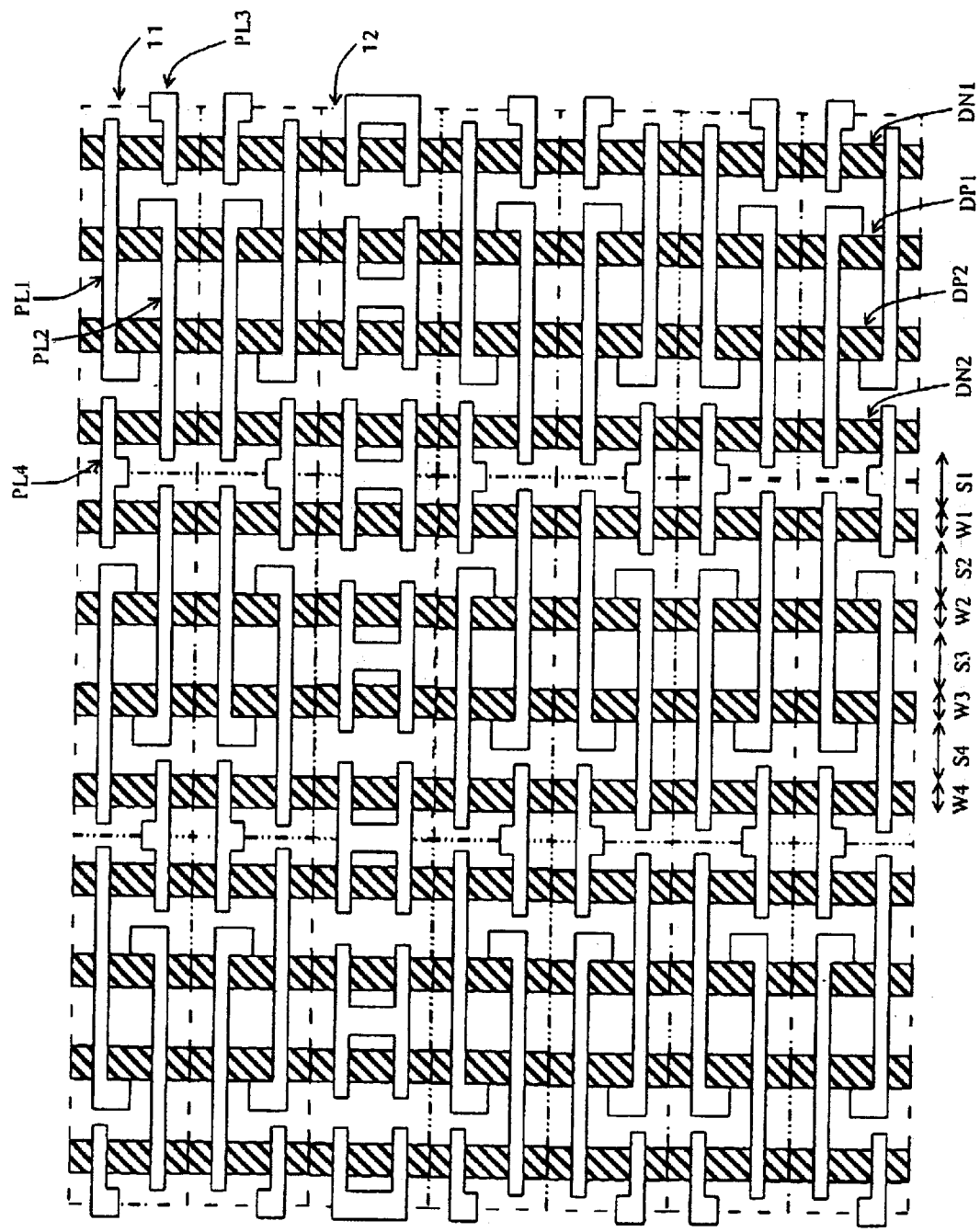
FIG. 7 is a diagram showing layout of a CMOS-type SRAM memory cell array of Embodiment 4.
Figure 8:
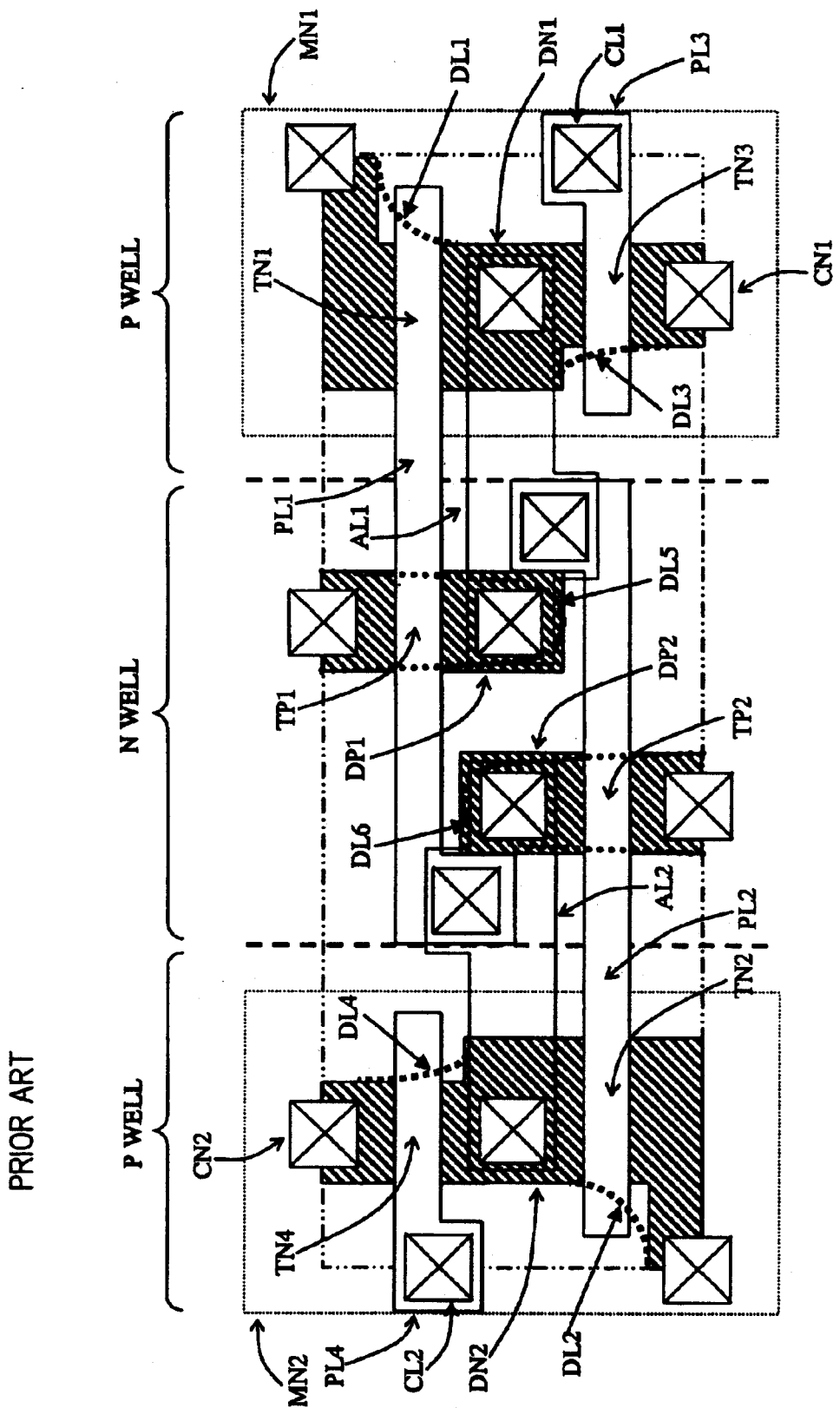
FIG. 8 is a diagram showing the layout of the prior art CMOS-type SRAM memory cell.
Figure 9:
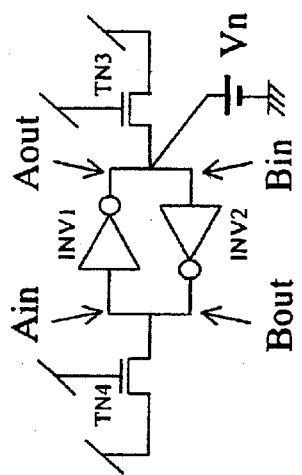
FIG. 9 is a circuit diagram for estimating the stability of data holding of the memory cell.
Figure 11:
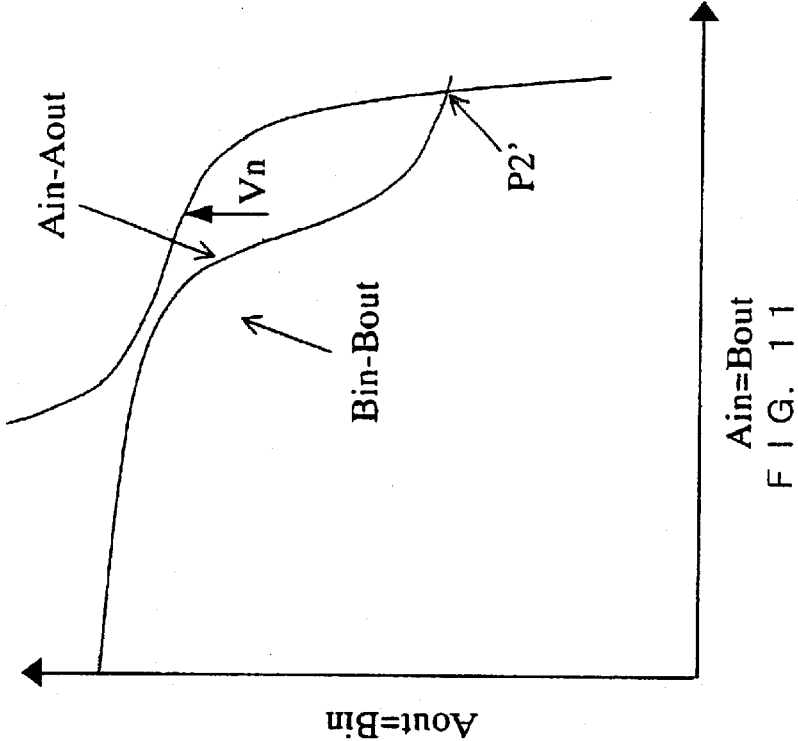
FIG. 11 is a diagram showing input/output characteristics of an inverter circuit in the memory cell in the case that capability of the access transistor is enhanced.
Figure 10:
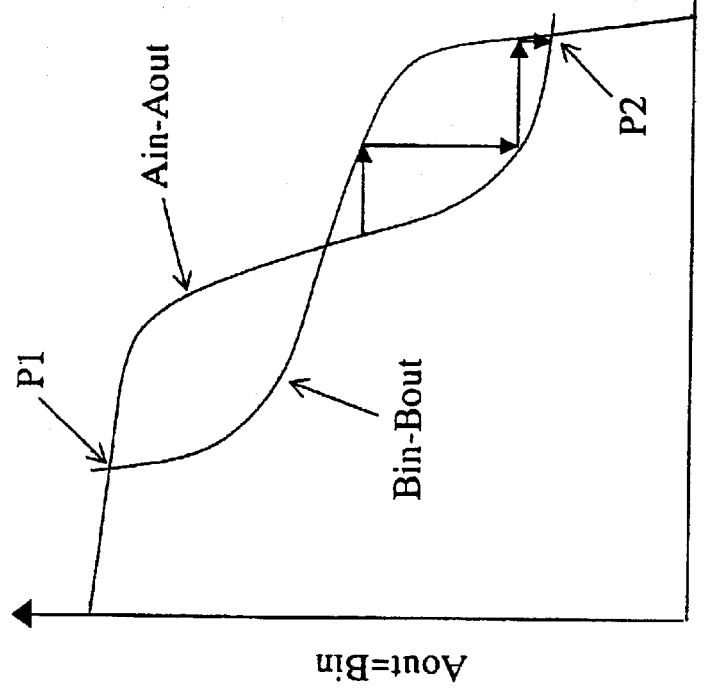
FIG. 10 is a diagram showing input/output characteristics of an inverter circuit in the memory cell.

FIG. 7 shows part of memory cell array in which memory cells as shown in FIG. 6 are arranged in a grid pattern. The substrate contact cell 12 is interposed at regular intervals between the memory cells aligning in a longitudinal direction. For convenience of explanation, only polysilicon wires PL1, PL2, PL3 and PL4 and diffusion regions DN1, DP1, DP2 and DN2 are shown in a simplified layout of the memory cell and substrate contact cell of FIG. 7.

With the memory cell array of this embodiment, the diffusion regions of the substrate contact cell are arranged in linear shapes in contiguous to the memory cell array so that diffusion regions are placed with linear shapes over the whole memory array without breaking off. Further, each diffusion region is disposed at the uniform width and the uniform interval (S1=S2=S3=S4, W1=W2=W3=W4).

With the memory cell array of this embodiment, as peripheral layout form of diffusion regions is uniform at any part, changes of finished and processed form becomes uniform. As a result, changes in channel width of transistors can be suppressed, thereby minimizing variations in transistor's characteristics.

As has been explained, with the semiconductor memory device of the present invention, it is possible to lay out the n-type diffusion regions in linear shapes without any bent part while ensuring data holding stability by generating a difference between the access transistors and the drive transistors in driving capability without making channel width of the access transistors and the drive transistors different. Accordingly, there causes no change in channel width of transistors due to round-off, and therefore variations in characteristics of the nMOS transistors can be suppressed. Moreover, as the drive transistors and access transistors can be constructed so as to have the same channel width, variations in characteristics are further suppressed. This allows for a narrower channel width, enabling reduction in cell area.

Further, with the semiconductor memory device of the present invention, as the p-type diffusion regions are arranged in linear shapes without any end part, there causes no change in channel width of transistors due to round-off, thereby suppressing variations in characteristics of the pMOS transistors. Looking from the aspect of the n-type diffusion regions, since peripheral layout form of the n-type diffusion regions becomes uniform, changes of channel width in processed form of the access transistors and the drive transistors also become uniform, thereby suppressing variations in characteristics of the transistors. And, gates of two pMOS transistors for separating p-type diffusion regions are connected to gates of inverter circuits, and gate capacitance is added to data latch node, resulting in improvement of the stability of data holding against noise.

Furthermore, in the semiconductor memory device according to the present invention, by applying n-type diffusion on the diffusion regions of pMOS separating transistors to pMOS load transistors, vacant region in the memory cell can be used effectively as substrate contact region.

Furthermore, in the semiconductor memory device according to the present invention, by providing transistors whose gates are fixed in OFF state above and under the substrate contact region both in n-type diffusion region and p-type diffusion region,, the diffusion region of the substrate contact cell can be arranged in a linear shape in contiguous to the diffusion region of the memory cell. In this way, over the whole memory cell array, diffusion regions can be arranged in linear shapes without any bent part and partial separation, so that changes in characteristics of transistors above and under the substrate contact region can be suppressed.

Furthermore, in the semiconductor memory device according to the present invention, by locating all diffusion regions at regular intervals, it is possible to keep changes in finished and processed form due to peripheral layout form at a constant value. Moreover, by locating all diffusion regions at a same width, it is possible to keep width and form of the diffusion regions constant.

Clearly, numerous modifications and variations of the instant invention are possible in light of the above teachings. It is therefore understood that, within the scope and spirit of the claims made herein, the invention may be practiced otherwise than as specifically described herein, the invention may be modified in arrangement and detail without departing from such scope and spirit and, further, the utility described herein is by way of example.

What is claimed is:

1. A semiconductor memory device having SRAM memory cell comprising:

a first inverter including a first nMOS transistor and a first pMOS transistor; a second inverter including a second nMOS transistor and a second pMOS transistor; a third nMOS transistor; and a fourth nMOS transistor, wherein an input node of said first inverter is connected to an output node of said second inverter; and an input node of said second inverter is connected to an output node of said first inverter;

one of a drain and a source of said third nMOS transistor is connected to the output node of said first inverter; the other of the drain and the source thereof is connected to a first bit line; and a gate thereof is connected to a word line;

one of a drain and a source of said fourth nMOS transistor is connected to the output node of said second inverter; the other of the drain and the source thereof is connected to a second bit line; and a gate thereof is connected to said word line;

a first diffusion region forming said first nMOS transistor and said third nMOS transistor and a second diffusion region forming said second nMOS transistor and said fourth nMOS transistor, respectively, are arranged in linear shapes without having any bent part; and current driving capabilities of said first and second nMOS transistors are higher than those of said third and fourth nMOS transistors, wherein a driving voltage of said word line is lower than a power supply voltage supplied to said first and second inverters.

2. A semiconductor memory device having a SRAM memory cell comprising:

a first inverter including a first nMOS transistor and a first pMOS transistor; a second inverter including a second nMOS transistor and a second pMOS transistor; a third nMOS transistor; a fourth nMOS transistor; wherein an input node of said first inverter is connected to an output node of said second inverter; and an input node of said second inverter is connected to an output node of said first inverter;

one of a drain and a source of said third nMOS transistor is connected to the output node of said first inverter; the other of the drain and the source thereof is connected to a first bit line; and a gate thereof is connected to a word line;

one of a drain and a source of said fourth nMOS transistor is connected to the output node of said second inverter; the other of the drain and the source thereof is connected to a second bit line; and a gate thereof is connected to said word line;

a first diffusion region forming said first nMOS transistor and said third nMOS transistor and a second diffusion region forming said second nMOS transistor and said fourth nMOS transistor, respectively, are arranged in linear shapes without having any bent part;

current driving capabilities of said first and second nMOS transistors are higher than those of said third and fourth nMOS transistors; wherein a third diffusion region forming said first pMOS transistor and a fourth diffusion region forming said second pMOS transistor are arranged in linear shapes without having any bent part and located in parallel to said first and second diffusion regions; and wherein a third pMOS transistor is formed adjacent to a drain of said first pMOS transistor on said third diffusion region; and a fourth pMOS transistor is formed adjacent to a drain of said second pMOS transistor on said fourth diffusion region, wherein
gates of said first nMOS transistor, said first pMOS transistor and said fourth pMOS transistor are connected in succession via a first polysillicon wire;
gates of said second nMOS transistor, said second pMOS transistor and said third pMOS transistor are connected in succession via a second polysillicon wire; and
an absolute value of threshold voltage of said third and fourth pMOS transistors is higher than a power supply voltage supplied to said first and second inverters.

3. A semiconductor memory device according to claim 2, wherein n-type diffusion regions are provided on the opposite side of the diffusion region of said third pMOS transistor to said first pMOS transistor and on the opposite side of the diffusion region of said fourth pMOS transistor to said second pMOS transistor to fix a potential of an N-well region forming pMOS transistors.

4. A semiconductor memory device having a SRAM memory cell comprising:
a first inverter including a first nMOS transistor and a first pMOS transistor; a second inverter including a second nMOS transistor and a second pMOS transistor; a third nMOS transistor; and a fourth nMOS transistor, wherein
an output node of said first inverter is connected to an output node of said second inverter; and an input node of said second inverter is connected to an output node of said first inverter;
one of a drain and a source of said third nMOS transistor is connected to the output node of said first inverter; the other of the drain and the source thereof is connected to a first bit line; and a gate thereof is connected to a word line;
one of a drain and a source of said fourth nMOS transistor is connected to the output node of said second inverter; the other of the drain and the source thereof is connected to a second bit line; and a gate thereof is connected to said word line;
a first diffusion region forming said first nMOS transistor and said third nMOS transistor and a second diffusion region forming said second nMOS transistor and said fourth nMOS transistor, respectively, are arranged in linear shapes without having any bent part; and
current driving capabilities of said first and second nMOS transistors are higher than those of said third and fourth nMOS transistors, wherein said first pMOS transistor is formed on a third diffusion region; said second pMOS transistor is formed on a fourth diffusion region; and said first, second, third and fourth diffusion regions are arranged at equally spaced intervals in the longitudinal direction of a connect line of transistor gates.

5. A semiconductor memory device having a SRAM memory cell comprising:
first inverter including a first nMOS transistor and a first MOS transistor; a second inverter including a second nMOS transistor and a second pMOS transistor; a third nMOS transistor; and a fourth nMOS transistor, wherein
an input node of said first inverter is connected to an output node of said second inverter; and an input node of said second inverter is connected to an output node of said first inverter;
one of a drain and a source of said third nMOS transistor is connected to the output node of said first inverter; the other of the drain and the source thereof is connected to a first bit line; and a sate thereof is connected to a word line;
one of a drain and a source of said fourth nMOS transistor is connected to the output node of said second inverter; the other of the drain and the source thereof is connected to a second bit line; and a gate thereof is connected to said word line;
a first diffusion region forming said first nMOS transistor and said third nMOS transistor and a second diffusion region forming said second nMOS transistor and said fourth nMOS transistor, respectively, are arranged in linear shapes without having any bent parts; and
current driving capabilities of said first and second nMOS transistors are higher than those of said third and fourth nMOS translators, wherein said first pMOS transistor is formed on a third diffusion region; said second pMOS transistor is formed on a fourth diffusion region; and said first, second, third and fourth diffusion regions are arranged so as to have a same width measured in the longitudinal direction of a connect line of transistor gates.

* * * * *